United States Patent [19]

Carey

[11] 4,356,344
[45] Oct. 26, 1982

[54] METAL-PLASTIC HEADER ASSEMBLY

[75] Inventor: James J. Carey, Henrietta, N.Y.

[73] Assignee: Chloride Electro Networks, Division of Chloride, Inc., N. American Operation, Tampa, Fla.

[21] Appl. No.: 228,187

[22] Filed: Jan. 26, 1981

[51] Int. Cl.³ .............................................. H05K 5/06
[52] U.S. Cl. ..................................... 174/52 S; 336/92
[58] Field of Search ............... 174/52 S, 52 H, 52 PE; 336/90, 92

[56] References Cited

U.S. PATENT DOCUMENTS

| | | | |
|---|---|---|---|
| 1,977,122 | 10/1934 | Ehrlich et al. | 336/92 |
| 3,081,374 | 3/1963 | Burch | 174/52 H X |
| 3,546,647 | 12/1970 | Roddy et al. | 336/92 |
| 3,656,217 | 4/1972 | Scott et al. | 174/52 H X |
| 4,208,699 | 6/1980 | Philpott et al. | 174/52 S X |

Primary Examiner—A. T. Grimley
Assistant Examiner—D. A. Tone
Attorney, Agent, or Firm—Finnegan, Henderson, Farabow, Garrett & Dunner

[57] ABSTRACT

A hermetic enclosure assembly having a metal header cover with interior and exterior portions and defining a plurality of apertures. A header body of rigid plastic material is adhered to and fills a substantial part of the interior portion of the header cover. A plurality of conductive leads protrude through the apertures, and bushings surround the conductive leads at the interior and exterior portions of the header cover where the pins protrude. A metal header casing is adhered to the metal header cover such that the interior portion of the header cover is completely enclosed. The assembly provides a minimum of plastic located exteriorly of the assembly and a maximum located interiorly.

9 Claims, 4 Drawing Figures

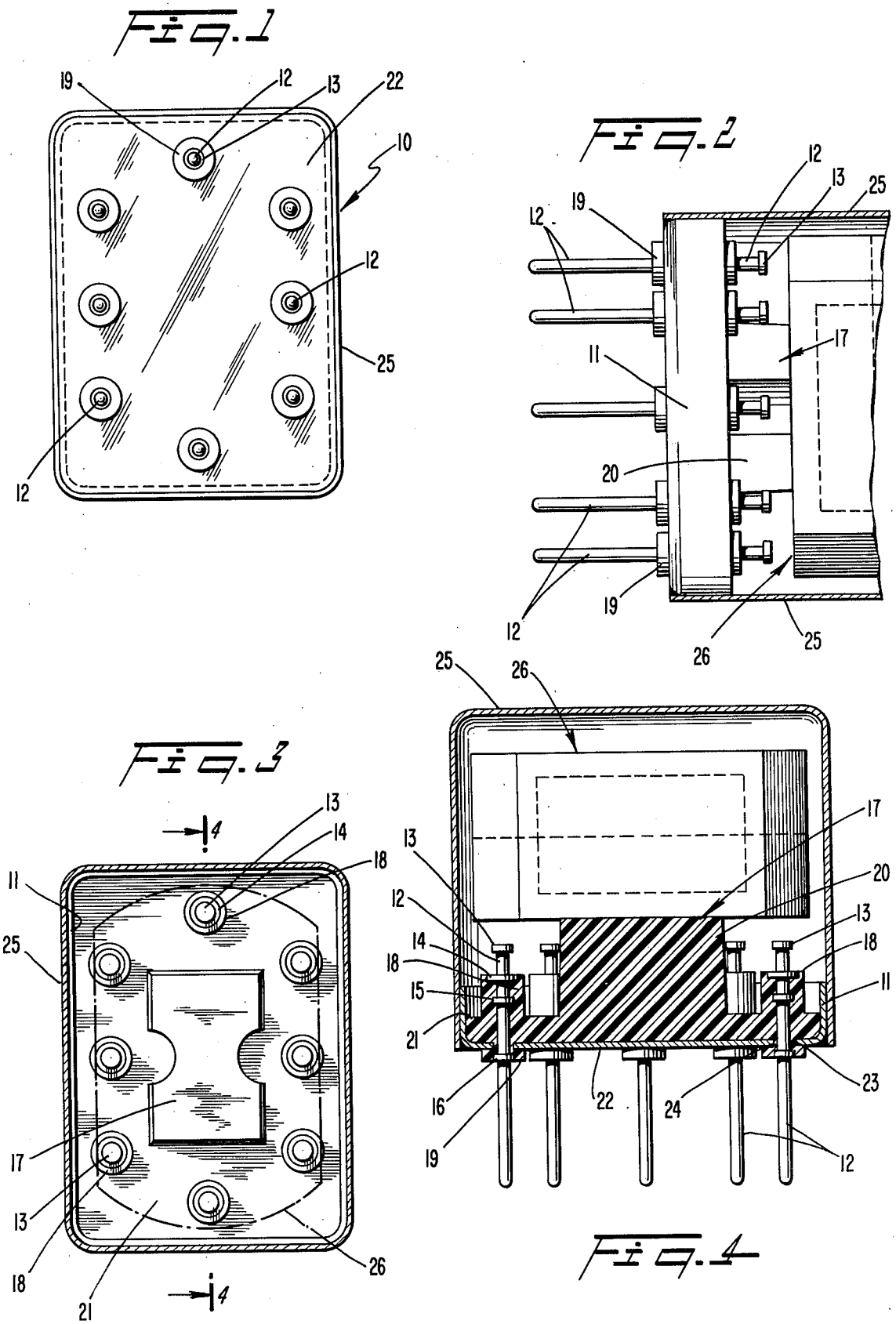

METAL-PLASTIC HEADER ASSEMBLY

BACKGROUND OF THE INVENTION

1. Field of the Invention

The invention relates to a metal-plastic header assembly to provide a hermetically sealed enclosure for electrical devices such as transformers and the like.

2. Description of the Prior Art

Hermetic enclosures to protect apparatus such as electric devices from potentially damaging materials in the atmosphere are known. These usually include a plastic or metal casing defining apertures through which conductive leads protrude and which are sealed to provide the desired hermeticity.

For example, some prior art apparatuses utilize a resilient material as the sealant to reduce tension between elements of the assembly and others use glass or plastic sealants. In known prior art apparatuses using plastic sealants, the plastic is utilized to seal only the voids at the apertures where the conductive pins protrude through the plastic or metal casings. In those instances where plastic headers are employed with matching plastic casings, the plastic casings are normally thin and are exposed to the atmosphere at their outer surfaces.

SUMMARY OF THE INVENTION

The present invention relates to an improvement over these prior art hermetically sealed enclosure assemblies and provides increased hermeticity to adverse atmospheric conditions such as moisture.

It is an object of this invention to provide improved operating conditions for electrical devices enclosed in hermetically sealed assemblies and increased protection from the adverse effects of atmospheric conditions such as moisture, corrosion causing chemicals and the like.

It is another object of the invention to provide an improved hermetically sealed assembly for electric devices for use in high humidity conditions which results in longer life and better operating conditions.

It is yet another object of this invention to provide an improved hermetically sealed assembly for electric devices in which the sealant used provides excellent insulation conditions for high voltage electric devices housed within the assembly.

Another object of this invention is to minimize the amount of moisture from the atmosphere that is able to creep into the assembly by maximizing the creepage distance, i.e., the distance that moisture has to travel from the atmosphere to within the assembly to provide a better hermetic seal and improved breakdown characteristics at high voltage operating levels.

To accomplish these objects, a hermetic enclosure assembly has been invented which includes a metal header cover having interior and exterior portions and defining a plurality of apertures. A header body is formed through a molding procedure and comprises a rigid plastic material securely adhered to and filling a substantial part of the interior portion of the header cover. To connect any electrical devices which may be enclosed in the assembly, a plurality of conductive leads protrude through the apertures.

In accordance with the preferred embodiment of the invention, the header body also comprises bushings surrounding and securely adhered to the portions of the pins located at the interior and exterior portions of the header cover where the pins protrude to provide extended creepage distance to maximize the distance that atmospheric moisture must travel to get inside the hermetic enclosure. Also, in accordance with the invention, the assembly comprises a metal header casing securely adhered to the metal header cover such that the interior portion of the header cover is completely enclosed to form the hermetic enclosure.

The invention also contemplates that the header body further comprises a support for an electrical device such as a transformer to be enclosed within the assembly and that the pins have a plurality of shoulders which are embedded and interlocked with the rigid plastic material of the header body to prevent movement of the pins therein.

BRIEF DESCRIPTION OF THE DRAWINGS

FIG. 1 is a bottom view of the header body formed in the header cover in accordance with the invention;

FIG. 2 is an end view of the header body and header cover shown in FIG. 1, with a portion of the header casing being illustrated;

FIG. 3 is a top view of the header body and header cover of FIG. 1;

FIG. 4 is a sectional view of the header body and header cover taken along section lines 4—4 of FIG. 3, and further including the header casing of FIG. 2.

DETAILED DESCRIPTION OF THE INVENTION

FIG. 1 illustrates the hermetic enclosure assembly 10 in accordance with the invention. More particularly, the assembly 10 includes header cover 11 which defines a plurality of apertures 23 (FIG. 4) through which terminal pins 12 protrude. As shown in greater detail in FIG. 4, pins 12 comprise integral flat ends 13 and first, second and third shoulder portions 14, 15 and 16, respectively.

The header body generally designated 17 comprises a rigid plastic material to electrically insulate the pins from one another and to provide a hermetic seal for the electrical device contained within the header assembly. Header body 17 is formed by a molding procedure such as the well-known transfer molding process. In accordance with the molding process, pins 12 are placed in a mold (not shown) and securely positioned such that their longitudinal centers are substantially aligned with the centers of apertures 23, the diameter of the apertures being somewhat greater than the diameters of the pins. The mold is then closed and a thermosetting plastic such as an epoxy plastic in molten form is forced into the mold so that it completely surrounds portions of the pins 12 and fills a substantial portion of the inside of header cover 11 as shown in FIGS. 1–4. The plastic is cured in the mold to form rigid plastic header body 17 securely adhered to header cover 11 and pins 12, and the resulting header body/cover combination is then removed after curing.

As shown in FIG. 4, shoulders 14, 15 and 16 are embedded in the plastic material during molding and curing to securely position the pins therein and prevent movement of the pins when the assembly 10 is being used. Plastic bushings 18 and 19 are also formed as a result of the molding procedure described above as an integral part of the header body 17. Bushings 18 are securely adhered to pins 12, surrounding them from the top surface of shoulder 14 to the top surface 21 of the plastic material which fills the inside of header cover 11.

Bushings 19 are also securely adhered to pins 12, completely surrounding them from the lower surface of shoulder 16 to the outside surface 22 of header cover 11. The spaces 24 between the pins and the apertures 23 are also filled with plastic material. The header body 17 also includes a raised portion 20 located within the assembly 10 to provide a mounting block for the core and coil of the transformer 26 shown in FIG. 4. However, it is to be emphasized that while a transformer assembly is shown in the preferred embodiment of the invention, other electrical devices requiring a hermetically sealed atmosphere may be substituted therefor without departing from the spirit and scope of the invention.

The header body 17 thus includes a number of integral portions which provides a substantial mass of plastic located interiorly of the assembly to seal the interior of the assembly 10 from the atmosphere, securely adhere the conductive pins in proper position, and provide a support for the electrical device or devices included in the assembly. Header casing 25 which preferably comprises a metal material is inserted over the header cover 11 to form the completed assembly. The seal between the header casing and header cover may be effected by soldering or welding or any other suitable means in accordance with the invention.

The completed assembly 10 (FIG. 4) provides an improved hermetically sealed enclosure compared to prior art devices. In the assembly 10, only a small amount of plastic, that portion comprising bushings 19 surrounding the pins, is located outside the header cover 11. The relatively large amount of plastic of header body 17 included within the header cover provides a large area for the plastic, in conjunction with the metal material comprising header cover 11 and header casing 25, to seal out damage-causing materials which might be in the atmosphere.

The assembly in accordance with the invention therefor provides a minimum amount of plastic which is directly in contact with the atmosphere, and maximizes the amount of plastic which is included within the metal enclosure comprising assembly 10 and which interacts with that enclosure to provide an effective seal from the atmosphere, resulting in a significant improvement over prior art devices. The rigid thermosetting material comprising the header body 17 is further able to withstand high voltage characteristics of electrical devices such as transformers which may be sealed within assembly 10, and provides electrical insulation between the pins 12.

With respect to FIGS. 2 and 4, bushings 19 and 18 which respectively surround pins 12 at the outer and inner surfaces of the header cover 11, provide an extended length of path that atmospheric humidity must travel to get to the terminal portion 13 of the pins. This serves to minimize the amount of moisture from the atmosphere that is able to creep to within the assembly 10. Maximizing the creepage distance, i.e., the distance that moisture has to creep from the atmosphere to within assembly 10 provides a better hermetic seal and improved breakdown characteristic at high voltage levels compared to prior art devices.

While there have been shown and described what are at present considered to be the preferred embodiments of the invention, modifications will readily occur to those skilled in the art. It is not desired, therefore, that the invention be limited to the specific arrangements shown and described and it is intended to cover in the appended claims all such modifications as fall within the true spirit and scope of the invention.

I claim:

1. A hermetic enclosure assembly for a high voltage transformer comprising:

a metal header cover having interior and exterior portions and defining a plurality of apertures, a header body comprising a rigid thermosetting plastic material form securely adhered to and filling a substantial part of the interior portion of the header cover, a plurality of conductive pins protruding through said apertures, the header body further comprising first and second bushings surrounding and securely adhered to first and second portions of each of the pins respectively located at the interior and exterior portions of the header cover where the pins protrude, the form and the first and second bushings of the header body being integral whereby the rigid thermosetting plastic material of which the header body is composed hermetically seals any remaining open spaces in the apertures, the first and second bushings providing a long creepage distance for moisture to travel along the pins from the outside of the assembly to inside the assembly to minimize moisture in the atmosphere from developing inside the assembly, and wherein the header body and header cover seal the interior of the assembly from potentially damaging materials and conditions in the atmosphere surrounding it.

2. The hermetic enclosure assembly of claim 1 wherein the header body comprises an integrally formed inwardly extending portion as a support for an electrical device to be enclosed in the hermetic enclosure assembly.

3. The hermetic enclosure assembly of claim 1 wherein each of the pins comprises a plurality of shoulders which are embedded in the rigid plastic thermosetting material comprising the header body to prevent movement of the pins therein.

4. The hermetic enclosure assembly of claim 1 further comprising a metal header casing securely adhered to the metal header cover such that the interior portion of the header cover is completely enclosed.

5. The hermetic enclosure assembly of claim 4 wherein the first and second bushings provide a long creepage distance for moisture to travel along the pins from the outside of the assembly to inside the assembly to minimize moisture in the atmosphere from developing inside the assembly.

6. The hermetic enclosure of claim 5 wherein the header body comprises an integrally formed inwardly extending portion as a support for an electrical device to be enclosed in the hermetic enclosure assembly.

7. The hermetic enclosure assembly of claim 6 wherein each of the pins comprises a plurality of shoulders which are embedded in the rigid plastic thermosetting material comprising the header body to prevent movement of the pins therein.

8. The hermetic enclosure assembly of claim 4 wherein the header body comprises an integrally formed inwardly extending portion as a support for an electrical device to be enclosed in the hermetic enclosure assembly.

9. The hermetic enclosure assembly of claim 4 wherein each of the pins comprises a plurality of shoulders which are embedded in the rigid plastic material comprising the header body to prevent movement of the pins therein.

* * * * *